US008847436B2

(12) United States Patent
Maxik et al.

(10) Patent No.: US 8,847,436 B2
(45) Date of Patent: Sep. 30, 2014

(54) SYSTEM FOR INDUCTIVELY POWERING AN ELECTRICAL DEVICE AND ASSOCIATED METHODS

(75) Inventors: Fredric S. Maxik, Indialantic, FL (US); David E. Bartine, Cocoa, FL (US); Robert R. Soler, Cocoa Beach, FL (US); Daniel Pierron, Rockledge, FL (US)

(73) Assignee: Lighting Science Group Corporation, Satellite Beach, FL (US)

( * ) Notice: Subject to any disclaimer, the term of this patent is extended or adjusted under 35 U.S.C. 154(b) by 75 days.

(21) Appl. No.: 13/608,999

(22) Filed: Sep. 10, 2012

(65) Prior Publication Data

US 2013/0099696 A1    Apr. 25, 2013

Related U.S. Application Data (60) Provisional application No. 61/533,570, filed on Sep. 12, 2011.

(51) Int. Cl.
H01F 27/42 (2006.01)
H01F 37/00 (2006.01)
H01F 38/00 (2006.01)
H05K 13/00 (2006.01)
H01F 38/14 (2006.01)
H05B 37/02 (2006.01)
F21V 17/10 (2006.01)

(52) U.S. Cl.
CPC ............ *H01F 38/14* (2013.01); *H05K 13/0023* (2013.01); *H05B 37/02* (2013.01); *F21V 17/105* (2013.01)
USPC ........................................................ 307/104

(58) Field of Classification Search
CPC ....................................................... H01F 38/14
USPC .................... 307/104; 320/108; 315/291, 362
See application file for complete search history.

(56) References Cited

U.S. PATENT DOCUMENTS

| 5,221,877 A | 6/1993 | Falk |
| 5,523,878 A | 6/1996 | Wallace et al. |
| 5,680,230 A | 10/1997 | Kaburagi et al. |
| 5,704,701 A | 1/1998 | Kavanagh et al. |
| 5,997,150 A | 12/1999 | Anderson |

(Continued)

FOREIGN PATENT DOCUMENTS

| CN | 101 702 421 A | 5/2010 |
| WO | WO 2009/121539 A1 | 10/2009 |
| WO | WO 2012/158665 | 11/2012 |

OTHER PUBLICATIONS

U.S. Appl. No. 13/739,893, filed Jan. 2013, Holland et al.

(Continued)

Primary Examiner — Rexford Barnie
Assistant Examiner — Rasem Mourad
(74) Attorney, Agent, or Firm — Mark R. Malek; Daniel C. Pierron; Zies Widerman & Malek (57) ABSTRACT

An inductive coupling system for delivering power from an induction assembly attached to a first side of a structure to a load assembly positioned on a second side of a structure. The induction assembly may couple with the load assembly so as to removably attach the load assembly to the second side of the structure. Furthermore, a triggering device in the load assembly may initiate the inductive coupling between the induction and load assemblies.

21 Claims, 3 Drawing Sheets

(56) References Cited

U.S. PATENT DOCUMENTS

| | | | |
|---|---|---|---|
| 6,027,225 | A | 2/2000 | Martin et al. |
| 6,140,646 | A | 10/2000 | Busta et al. |
| 6,341,876 | B1 | 1/2002 | Moss et al. |
| 6,356,700 | B1 | 3/2002 | Strobl |
| 6,369,517 | B2 | 4/2002 | Song et al. |
| 6,594,090 | B2 | 7/2003 | Kruschwitz et al. |
| 6,641,283 | B1 | 11/2003 | Bohler |
| 6,767,111 | B1 | 7/2004 | Lai |
| 6,817,735 | B2 | 11/2004 | Shimizu et al. |
| 6,870,523 | B1 | 3/2005 | Ben-David et al. |
| 6,871,982 | B2 | 3/2005 | Holman et al. |
| 6,974,713 | B2 | 12/2005 | Patel et al. |
| 7,072,096 | B2 | 7/2006 | Holman et al. |
| 7,075,707 | B1 | 7/2006 | Rapaport et al. |
| 7,083,304 | B2 | 8/2006 | Rhoads |
| 7,178,941 | B2 | 2/2007 | Roberge et al. |
| 7,246,923 | B2 | 7/2007 | Conner |
| 7,255,469 | B2 | 8/2007 | Wheatley et al. |
| 7,261,453 | B2 | 8/2007 | Morejon et al. |
| 7,289,090 | B2 | 10/2007 | Morgan |
| 7,300,177 | B2 | 11/2007 | Conner |
| 7,303,291 | B2 | 12/2007 | Ikeda et al. |
| 7,325,956 | B2 | 2/2008 | Morejon et al. |
| 7,342,658 | B2 | 3/2008 | Kowarz et al. |
| 7,349,095 | B2 | 3/2008 | Kurosaki |
| 7,400,439 | B2 | 7/2008 | Holman |
| 7,429,983 | B2 | 9/2008 | Islam |
| 7,434,946 | B2 | 10/2008 | Huibers |
| 7,436,996 | B2 | 10/2008 | Ben-Chorin |
| 7,438,443 | B2 | 10/2008 | Tatsuno et al. |
| 7,476,016 | B2 | 1/2009 | Kurihara |
| 7,479,861 | B2 | 1/2009 | Zepke et al. |
| 7,520,642 | B2 | 4/2009 | Holman et al. |
| 7,530,708 | B2 | 5/2009 | Park |
| 7,540,616 | B2 | 6/2009 | Conner |
| 7,556,406 | B2 | 7/2009 | Petroski et al. |
| 7,598,686 | B2 | 10/2009 | Lys et al. |
| 7,598,961 | B2 | 10/2009 | Higgins |
| 7,626,755 | B2 | 12/2009 | Furuya et al. |
| 7,677,736 | B2 | 3/2010 | Kasazumi et al. |
| 7,684,007 | B2 | 3/2010 | Hull et al. |
| 7,703,943 | B2 | 4/2010 | Li et al. |
| 7,705,810 | B2 | 4/2010 | Choi et al. |
| 7,709,811 | B2 | 5/2010 | Conner |
| 7,719,766 | B2 | 5/2010 | Grasser et al. |
| 7,728,846 | B2 | 6/2010 | Higgins et al. |
| 7,766,490 | B2 | 8/2010 | Harbers et al. |
| 7,806,575 | B2 | 10/2010 | Willwohl et al. |
| 7,824,075 | B2 | 11/2010 | Maxik et al. |
| 7,828,453 | B2 | 11/2010 | Tran et al. |
| 7,832,878 | B2 | 11/2010 | Brukilacchio et al. |
| 7,834,867 | B2 | 11/2010 | Sprague et al. |
| 7,845,823 | B2 | 12/2010 | Mueller et al. |
| 7,905,637 | B2 | 3/2011 | Caluori et al. |
| 7,922,356 | B2 | 4/2011 | Maxik et al. |
| 8,004,203 | B2 * | 8/2011 | Maxik ............................ 315/247 |
| 8,016,443 | B2 | 9/2011 | Falicoff et al. |
| 8,047,660 | B2 | 11/2011 | Penn et al. |
| 8,049,763 | B2 | 11/2011 | Kwak et al. |
| 8,083,364 | B2 | 12/2011 | Allen |
| 8,096,668 | B2 | 1/2012 | Abu-Ageel |
| 8,172,436 | B2 | 5/2012 | Coleman et al. |
| 8,212,836 | B2 | 7/2012 | Matsumoto et al. |
| 8,297,783 | B2 | 10/2012 | Kim |
| 8,331,099 | B2 | 12/2012 | Geissler et al. |
| 8,337,029 | B2 | 12/2012 | Li |
| 8,384,984 | B2 | 2/2013 | Maxik et al. |
| 2004/0052076 | A1 | 3/2004 | Mueller et al. |
| 2006/0002108 | A1 | 1/2006 | Ouderkirk et al. |
| 2006/0002110 | A1 | 1/2006 | Dowling et al. |
| 2006/0164005 | A1 | 7/2006 | Sun |
| 2006/0285193 | A1 | 12/2006 | Kimura et al. |
| 2007/0013871 | A1 | 1/2007 | Marshall et al. |
| 2007/0159492 | A1 | 7/2007 | Lo et al. |
| 2008/0143973 | A1 | 6/2008 | Wu |
| 2008/0198572 | A1 | 8/2008 | Medendorp |
| 2008/0232084 | A1 | 9/2008 | Kon |
| 2009/0027900 | A1 | 1/2009 | Janos et al. |
| 2009/0036952 | A1 | 2/2009 | Kao et al. |
| 2009/0059585 | A1 | 3/2009 | Chen et al. |
| 2009/0128781 | A1 | 5/2009 | Li |
| 2009/0212637 | A1 * | 8/2009 | Baarman et al. ............... 307/104 |
| 2010/0006762 | A1 | 1/2010 | Yoshida et al. |
| 2010/0202129 | A1 | 8/2010 | Abu-Ageel |
| 2010/0219698 | A1 * | 9/2010 | Azancot et al. ............... 307/104 |
| 2010/0231863 | A1 | 9/2010 | Hikmet et al. |
| 2010/0244700 | A1 | 9/2010 | Chong et al. |
| 2010/0259401 | A1 * | 10/2010 | Azancot et al. ............... 340/657 |
| 2010/0315320 | A1 | 12/2010 | Yoshida |
| 2010/0320928 | A1 | 12/2010 | Kaihotsu et al. |
| 2010/0321641 | A1 | 12/2010 | Van Der Lubbe |
| 2011/0006611 | A1 * | 1/2011 | Baarman et al. ............... 307/104 |
| 2011/0310446 | A1 | 12/2011 | Komatsu |
| 2012/0140440 | A1 | 6/2012 | Dam et al. |
| 2012/0188769 | A1 | 7/2012 | Lau |
| 2012/0286700 | A1 | 11/2012 | Maxik et al. |
| 2013/0099696 | A1 | 4/2013 | Maxik et al. |

OTHER PUBLICATIONS

U.S. Appl. No. 13/832,969, filed Mar. 2015, Holland et al.

Sengupta, Upal, "How to Implement A 5-W Wireless Power System", How2Power Today, pp. 1-8, (Jul. 2010).

* cited by examiner

SYSTEM FOR INDUCTIVELY POWERING AN ELECTRICAL DEVICE AND ASSOCIATED METHODS

RELATED APPLICATIONS

This application claims the benefit of U.S. Provisional Patent Application No. 61/533,570 entitled "System for Wireless Powering of Electrical Devices" filed Sep. 12, 2011, the entire contents of which are incorporated herein by reference.

FIELD OF THE INVENTION

The present invention relates to systems and methods for inductively powering an electrical device. More specifically, the invention relates to systems and methods for establishing an inductive coupling between an induction assembly and a load assembly.

BACKGROUND OF THE INVENTION

This background information is provided to reveal information believed by the applicant to be of possible relevance to the present invention. No admission is necessarily intended, nor should be construed, that any of the preceding information constitutes prior art against the present invention.

The use of resonant magnetic induction for the powering of electrical devices is increasing. Systems for the inductive charging of target electrical devices, such as toothbrushes and mobile electronics, are available in consumer products and offer an alternative having to establish a physical connection between the device and a power source. Moreover, such systems typically employ the use of a base station that the target device is disposed on or within. However, these systems have universally relied on the base station being in an open and visible position, such that the target device can be disposed on or within the base station.

In particular settings, most commonly the medical field, the inductive charging of devices not positioned on or within the base station is used, for instance, an electrical device implanted within a patient. However, due to limiting factors involved with the implanting of an electrical device having metallic components, such systems and technologies are generally disadvantageous to use in non-medical applications.

U.S. Pat. No. 7,479,861 discloses a system for inductively transferring power between primary and secondary windings separated by an air gap, wherein the primary winding is attached to and receives power from an elevator car, and the secondary winding is attached to a wall and is connected to a fixture, the power delivered by the primary winding to the secondary winding powering the fixture. Furthermore, an electronic module associated with the secondary winding may be able to communicate with an elevator controller. Additionally, the electronic module may be able to control the application of power to the fixtures. However, the disclosed solution does not address selective operation of the primary coil by the presence or absence of a triggering device indicating the presence of the secondary winding in proximity to the primary coil.

Additionally, the installation of fixtures and other housings containing an electrical device into a semi-permanent but detachable attachment is currently accomplished generally by the use of fasteners, such as screws, nails, and tacks, the use of adhesives and glues, or the use of glues in conjunction with hook-and-loop devices. Moreover, in order to deliver electrical power to such attached devices, an electrical connection has been accomplished by a physical connection between the device and a power source, typically in the form of wires connected therebetween. Furthermore, in order to increase the aesthetic appeal of the installation of the electrical device, the wiring has typically been disposed in a hidden or otherwise generally non-visible location for the setting in which the device is installed. However, because the electrical device is generally desirously disposed in a visible location, a hole, aperture, or any other type of void must be established between the positions of the wiring and the electrical device. Typically, this means drilling a hole in the wall, table, desk, console, or other structure to which the electrical device is attached. This has the undesirable consequence of leaving a hole when the housing containing the electrical device is removed or otherwise vacates its attached position, necessitating the patching of the hole to preserve aesthetic appeal. Therefore, there is a need for a solution to delivering power to an electrical device while also facilitating the installation and removable attachment of the device without alteration of the surface to which the electrical device is to be attached.

SUMMARY OF THE INVENTION

With the foregoing in mind, embodiments of the present invention are related to systems and methods for providing power to an electrical device including an induction assembly and a load assembly. In one embodiment, the induction assembly may include an induction circuit that is operable to inductively couple with a corresponding receiver circuit, a switch configured to control the operation of the induction circuit, and an attaching device. The switch may be transitionable between two states, where the induction circuit is inoperable in a first state and operable in a second state. The load assembly may include a receiver circuit operable to inductively couple with the induction circuit, an electrical device that is configured to be powered via the inductive coupling between the induction circuit and the receiver circuit, an attaching device, and a triggering device. The triggering device, when brought into or out of proximity of the switch, may cause the switch to transition between the first and second states. In some embodiments, the triggering device may be a magnet, and the switch may be a device that is sensitive to the presence or absence of magnetic ds, such as reed switches and Hall effect switches, for example. Additionally, the induction assembly may be attached to a first surface of a structure. When the load assembly is brought into a position interfacing with a second surface of the structure and generally opposite the induction assembly, the attaching devices of the induction and load assemblies may interact so as to removably attach the load assembly to the second side of the structure. In some embodiments, the attaching devices of the induction and load assemblies may be magnets. Furthermore, the electrical device may be an illuminant, such as a light-emitting diode (LED), or an array of LEDs. Where the electrical device is an illuminant, it may be positioned so as to emit light in a desirable direction. Each of the induction and load assemblies may include a housing within which the constituent components of each assembly are disposed within and carried thereby.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper" "lower," and other like terms are used for the convenience of the reader in reference to the drawings. Also, a person skilled in the art should notice this description may contain other terminology to convey position, orientation, and direction without departing from the principles of the present invention.

An embodiment of the invention, as shown and described by the various figures and accompanying text, provides a system for inductively powering and remotely attaching an electrical device. More specifically, the system may include an induction assembly and a load assembly. The induction assembly may be configured to generate an induction field that inductively couples with an electrical device disposed within the load assembly so as to provide power to the electrical device, thereby energizing and enabling the operation of the electrical device.

Figure 1:
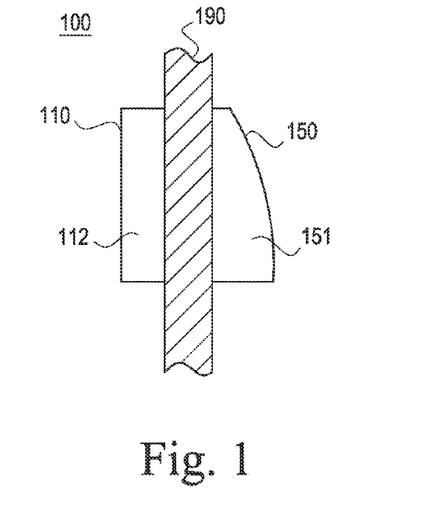
FIG. 1 is a side elevation view of a system for inductively providing power to an electrical device according to the present invention.

Referring now to FIG. 1, an embodiment of the invention will now be discussed in greater detail. A system 100 for inductively powering an electrical device is depicted having an induction assembly 110 and a load assembly 150. The induction assembly 110 may include a housing 112 that is configured to have disposed therein the various operational elements of the induction assembly 110. Similarly, the load assembly 150 may include a housing 151 that is configured to have disposed therein the various operational elements of the bad assembly 150.

Figure 2:
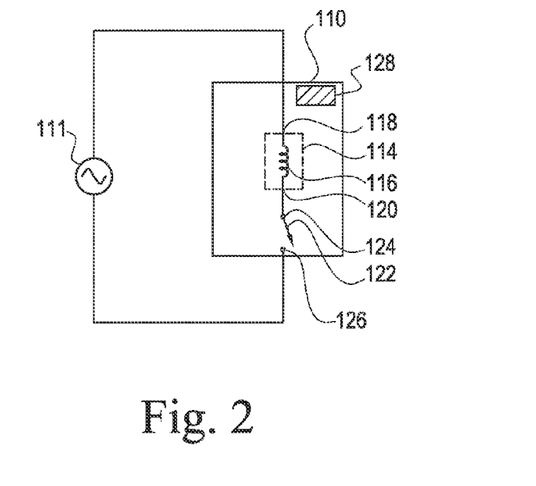
FIG. 2 is a schematic view of an induction assembly of the system depicted in FIG. 1.

Referring now to FIG. 2, the induction assembly 110 may further include an induction circuit 114. The induction circuit 114 may be designed as any circuit known to generate a magnetic field that is functional to electromagnetically induce an electric current in a corresponding receiver circuit, a phenomenon known as inductive coupling. In the present embodiment, the induction circuit 114 may include a solenoid 116, a coil of wire that acts as an electrical conductor, permitting the flow of current therethrough. As current travels through the solenoid 116, it generates a magnetic field proportional to the amount of current passing through the solenoid 116 according to Faraday's law, which is represented by the equation $$B = \mu_0 \frac{Ni}{l}$$

where B is the induced magnetic field, $\mu_0$ is the magnetic constant, N is the number of turns in the coil forming the solenoid 116, i is the current traveling through the solenoid 116, and l is the length of the solenoid 116. The induction circuit may further include other electrical components, including resistors, capacitors, diodes, transistors, amplifiers, and any other components that facilitate the induction of a magnetic field through the solenoid 116.

Additionally, the solenoid 116 may be configured to be capacitively loaded by one or more capacitors so that the induction circuit 114 may form a resonant circuit. It is known in the art that resonant inductively coupling has an efficiency advantage over non-resonant inductive coupling systems.

Where the induction circuit 114 is configured to operate as a resonant circuit, the resonant frequency of the induction circuit may be determined, or the components of the induction circuit 114 may be selected to produce a circuit with a desired resonant frequency, by the equation $$\omega = \sqrt{\frac{1}{LC}}$$

where w is the angular frequency, L is the inductance of the solenoid 116, and C is the capacitance of one or more capacitors of the induction circuit 114.

Furthermore, the amount of energy lost between the induction circuit 114 and a corresponding receiver circuit, discussed hereinbelow, may be determined by the equation $$Q = \frac{1}{R}\sqrt{\frac{L}{C}}$$

where Q is a factor that characterizes the damping of the induction circuit 114, and R is the resistance of at least one resistor of the induction circuit 114. A higher Q factor results in a lower amount of energy lost in the transfer of energy between the induction circuit 114 and a receiver circuit. The various components of the induction circuit 114 may be configured and arranged to result in a circuit having a desirable resonant frequency and Q factor so as to reduce the amount of energy lost in transfer to a receiver circuit.

The induction circuit 114 may further include a first connector 118 that enables the induction circuit 114 to be connected to a power source 111, and a second connector 120 that enables the induction circuit 114 to be connected to other elements of the induction assembly 110. Additionally, the induction circuit 114 may include electrical components necessary to convert power supplied by the power source 111 into electricity of appropriate voltage, current, and modulation for operation of the induction circuit 114.

The induction assembly 110 may further include a switch 122. The switch 122 may be configured to have a first state and a second state, and further may be transitionable between the first and second states. The switch 122 may be caused to transition between the first and second states, and vice versa, by a triggering event. The triggering event may include, but is not limited to, the presence or absence of an electromagnetic field and receiving an electronic instruction or command.

In the present embodiment, the switch 122 may be configured to transition from the first state to the second state when a magnetic field is generated within proximity of the switch 122. Various types of switches are known to have this type of functionality, including, without limitation, reed switches and Hall effect sensors. Where a Hall effect sensor is used, the switch 122 may further include circuitry that enables the sensor to function as a switch, as well as providing the necessary input voltage for the functioning of the switch. Accordingly, the switch 122 may include a connector that is electrically coupled to a power source. The switch 122 may be configured to transition from the first state to the second state when a magnetic field of sufficient strength, intensity, induction, or flux density above a threshold value is incident upon the switch 122.

The switch 122 may include a first connector 124 and a second connector 126 that may be configured to connect to other elements of the induction assembly. In the present embodiment, the first connector 124 may be connected to and in electric communication with the second connector 120 of the induction circuit 114. Furthermore, in the present embodiment, the second connector 126 may be configured to connect to an electric ground of the power source 111.

The first and second states of the switch 122 may be configured to control the operation of the induction circuit 114. More specifically, the first state of the switch 122 may be described as being in an open state, meaning that there is no electrical connection between the first connector 124 and the second connector 126 of the switch 122, preventing the flow of electrical current therethrough. In the present embodiment, where the switch is connected to and functionally and electrically coupled with the induction circuit 114, when the switch 122 is in the first state, no electric current may flow through the switch 122, and as there is no other path to an electric ground, currently accordingly may not flow through the induction circuit 114.

When the switch 122 is in the second state, the switch may be described as being in a closed state, meaning that there is an electrical connection between the first connector 124 and the second connector 126 of the switch 122, enabling the flow of current therethrough. In the present embodiment, when the switch 122 is in the second state, the flow of current through the switch 122 provides a path to an electrical ground for the induction circuit 114, thereby enabling the operation of the induction circuit 114.

Still referring to FIG. 2, the induction assembly 110 may further include an induction attaching device 128. The induction attaching device 128 may be configured to couple to a corresponding attaching device in another structure, device, or assembly, such as, for instance, the load assembly 150 as shown in FIG. 1. Furthermore, the coupling between the induction attaching device 128 and the corresponding attaching device may be accomplished remotely and at a distance. The coupling between the induction attaching device 128 and the corresponding attaching device may cause a remote attaching between the induction assembly 110 and the structure, device, or assembly containing the corresponding device, such as the load assembly 150, so that the load assembly 150 is prevented from moving with respect to the induction assembly 110 absent the influence of any outside force, aside from any force exerted by gravity.

The induction attaching device 128 may be any device that exerts a force on a corresponding attaching device so as to prevent the movement of the structure, device, or assembly containing the corresponding device with respect to the induction assembly. This attaching force may, for example, be exerted by the interaction between magnetic or electromagnetic fields between the induction attaching device 128 and the corresponding attaching device.

In the embodiment of the induction assembly 110 of the present invention depicted in FIG. 2, the induction attaching device 128 is a magnet. Furthermore, the induction attaching device 128 may be a magnet that generates a magnetic field of sufficient strength, intensity, induction, or flux density to exert a force upon a corresponding attaching device in the load assembly 150, thereby coupling the induction attaching device 128 and the corresponding attaching device so as to remotely attach the load assembly 150 to the inductor assembly 110, preventing any relative movement therebetween. The induction attaching device 128 may be any type of suitable magnet, including, by way of example only and not as a limitation, permanent magnets and electromagnets.

It is appreciated that the strength, intensity, induction, or flux density of a magnetic field, such as the field generated by the induction attaching device 128, decreases proportionally as the distance between the induction attaching device 128 and the corresponding attaching device increases. Therefore, the induction attaching device 128 may be configured to generate a magnetic field that exerts a sufficient force to remotely attach the load assembly 150, as depicted in FIG. 1, at some distance from the induction assembly 110. Furthermore, as shown in FIG. 1, both the induction assembly 110 and the load assembly 150 are depicted as being attached to a structure 190. In the embodiment of the present invention depicted in FIG. 1, the structure 190 may be a wall, for instance, a wall of known thickness. Alternatively, the structure 190 may be a table, desk, ceiling, household, commercial, or industrial appliance, console, automobile dashboard, or any other structure where it may be desirable to have the capability of inductively powering and remotely attaching an electrical device.

In some embodiments, the induction assembly 110 may be positioned in electronic communication with an external computerized device. The external computerized device may be configured to monitor the operation, power consumption, or any other operational characteristic of the induction assembly 110. In such embodiments, the induction assembly 110 may include a microcontroller positioned into said electronic communication. The microcontroller may be positioned in communication with the various elements of induction assembly 110, including the induction circuit 114, switch 122, and induction attaching device 128 so as to acquire operational information about said elements in order to relay such information to the external computerized device. Accordingly, the operation of the induction assembly 110, and by extension the system 100, may be monitored. The communication may be accomplished by any wired communication, including standards such as Ethernet, Universal Serial Bus (USB), FireWire, and Thunderbolt, as well as various forms of wireless communication, including 802.11/WiFi networking standards, Bluetooth, Zigbee, RuBee, Near-Field Communication (NFC), and any other methods and/or standards of wireless communication known in the art. The induction assembly 110 may include electronic devices capable of accomplishing such methods of communication.

Figure 3:
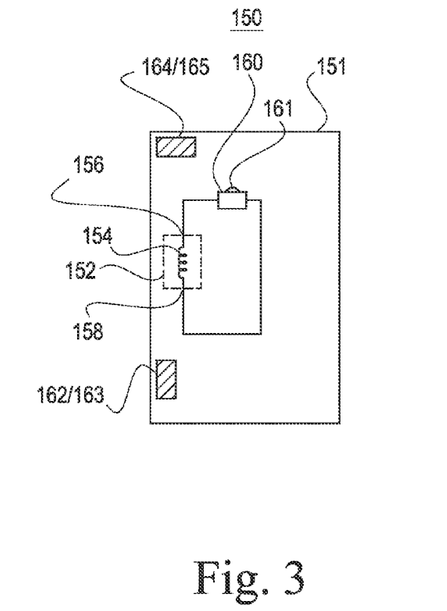
FIG. 3 is a schematic view of a load assembly of the depicted in FIG. 1.

Referring now to FIG. 3, the load assembly 150 will now be discussed in greater detail. The load assembly 150 may include a receiver circuit 152. The receiver circuit 152 may be configured to inductively couple with the induction circuit 114 of the inductor assembly 110 so as to receive electric power from the induction circuit 114. In the present embodiment, the receiver circuit 152 may include a solenoid 154, a coil of wire that permits the flow of electrical current therethrough. Furthermore, the solenoid 154 may be configured to permit a flow of current to be induced through the wire when in the presence of a magnetic field.

Additionally, the receiver circuit 152 may be configured to form a resonant inductive coupling with the induction circuit 114. Accordingly, where the induction circuit 114 is configured to have a resonant frequency, the receiver circuit 152 may include electrical components so as to configure the receiver circuit 152 to have a resonant frequency that is approximately equal to the resonant frequency of the induction circuit 114.

The receiver circuit 152 may include a first connector 156 and a second connector 158, each of which may be connected to other elements of the load assembly 150.

Continuing to refer to FIG. 3, the load assembly 150 may further include an electrical device 160. The electrical device 160 may be any device capable of being energized and rendered operable by electric power that is induced in the receiver circuit 152. Types of electrical devices that are contemplated for use in connection with the present invention include, without limitation, illuminants, electronic visual displays, photograph capture devices, video capture devices, loudspeakers, microphones, devices including a microcontroller, such as telephones, mobile telephones, GPS devices, and any accompanying circuitry. Those skilled in the art will appreciate that any electrically related device that is capable of receiving a powering charge is also contemplated for use in connection with the system according to the present invention.

In some embodiments of the present embodiment, the electrical device 160 may be an illuminant, which may be any device capable of emitting light upon being energized. Types of illuminants include, without limitation, incandescent light bulbs, fluorescent light bulbs, high-intensity discharge bulbs, and light-emitting semiconductors, such as light-emitting diodes (LEDs), and lasers. Furthermore, the electrical device 160 may comprise an array of illuminants, such as an array of LEDs. In the present embodiment, the electrical device 160 is an LED 161. When the LED 161 is energized, it operates to emit light. The LED 161 may be positioned relative to the other elements of the load assembly 150 and within the housing 151 so as to emit light in a desired direction. Accordingly, the housing 151 may include an aperture through which light emitted from the LED 161 may travel through and into the environment surrounding the load assembly 150.

Continuing to refer to FIG. 3, the load assembly 150 may further include a triggering device 162. The triggering device 162 may be configured to interact with the switch 122 of the induction assembly 110 so as to transition the switch between the first and second states. The triggering device 162 may be any device or mechanism that has properties or performs functions that operate as the triggering event for the switch 122. Where the switch 122 is a device that has a triggering event of the presence or absence of a magnetic field, the triggering device 162 may be a magnet. Furthermore, the triggering device may be a magnet of any type, including, without limitation, electromagnets and permanent magnets.

In some embodiments of the present invention, the triggering device 162 may be a triggering magnet 163. The triggering magnet 163 may be configured to generate a magnetic field of sufficient strength, intensity, induction, or flux density so as to effectuate the transition between the first and second states of the switch 122.

As disclosed above, the force exerted by a magnetic field upon an incident object may indirectly vary with the distance between the field source and the object. Accordingly, the switch 122 may be caused to transition between the first state and the second state when the magnetic field generated by the triggering magnet 163 is brought within a proximate distance of the switch 122 such that the triggering magnet 163 exerts a magnetic force above a threshold magnetic force on the switch 122. Therefore, the switch 122 and the triggering magnet 163 may be configured so that, when the triggering magnet 163 is at or within a known and/or predetermined distance from the switch 122, the force exerted by the magnetic field generated by the triggering magnet 163 is equal to or greater than the threshold magnetic force necessary to transition the switch 122 between the first and second states Furthermore, the magnetic field generated by the triggering magnet 163 may be configured to account for the separation between the induction assembly 110 and the load assembly 150 as depicted in FIG. 1, as well as the electromagnetic permittivity of any intermediate material, discussed in greater detail hereinbelow.

In an alternative embodiment, the triggering device 162 may be a device that communicates with the switch 122 via wireless communication with a trigger-detecting electronic device of the induction assembly 110 capable of performing wireless communication. Accordingly, the trigger-detecting electronic device may be included as part of the switch 122 or be disposed adjacent to the switch 122 in the induction assembly 110 and functionally coupled to the switch 122, such that trigger-detecting electronic device may enable the switch to transition between the first and second states described hereinabove. In addition to the wireless communication methods disclosed hereinabove, the triggering device 162 may be a radio-frequency identification (RFID) tag as is well known in the art. The trigger-detecting electronic device may detect the presence of the triggering device 162 within its proximity and cause the switch to transition between the first and second states. This particular embodiment employing the use of an RFID system demonstrates a single embodiment only and is not meant to limit the systems and methods of radio or other electromagnetic communication effectuating the transition of the switch 122 between the first and second states.

Continuing to refer to FIG. 3, the load assembly 150 may further include a load attaching device 164. The load attaching device 164 of the load assembly 150 may be configured to interact with and couple to the induction attaching device 128 of the induction assembly 110. Furthermore, the coupling between the induction attaching device 128 and the load attaching device 164 may cause the induction attaching device 128 to exert a force on the load attaching device 164 as described hereinabove, wherein the load attaching device 164 functions as the corresponding attaching device. As such, the force exerted on the load attaching device 164 by the induction attaching device 128 may prevent the movement of the load assembly 150 with respect to the induction assembly 110, discussed in greater detail hereinbelow.

The load attaching device 164 may be any device or mechanism that has properties or performs functions that operate to couple with the induction attaching device 128 of the induction assembly 110. Where the induction attaching device 128 is a device that generates a magnetic field, the load attaching device 164 may be a device that is responsive to and affected by a magnetic field. More specifically, the load attaching device 164 may be any device that, when in the presence of the magnetic field generated by the induction attaching device 128, has a force exerted upon the load attaching device 164 sufficient to removably attach the load assembly 150 to a structure.

Additionally, the force exerted upon the load attaching device 164 may be configured to be sufficiently weak to permit the de-coupling of the induction attaching device 128 and the load attaching device 164, and hence detachment of the load assembly 150, by the exertion of a force by a user, installer, or any other person or device that is attempting to detach the load assembly 150 from the structure 190, shown in FIG. 1. Furthermore, the load attaching device 164 may be a magnet of any type, including, without limitation, electromagnets and permanent magnets. In the present embodiment, the load attaching device 164 may be a magnet 165.

Figure 4:
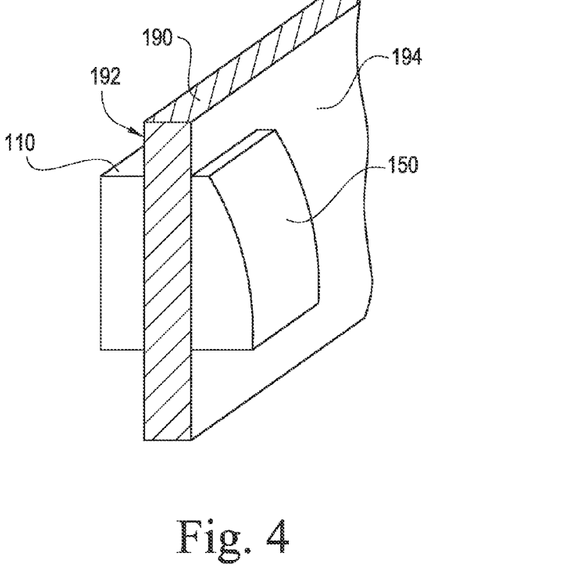
FIG. 4 is a perspective view of the system according to an embodiment of the present invention as depicted in FIG. 1 in a first orientation.

As shown in the embodiment depicted in FIG. 4, the induction assembly 110 may be attached to a first surface 192 of the structure 190, and the load assembly 150 may be attached to a second surface 194 of the structure. More specifically, the housing 112 of the induction assembly 110 may be configured to facilitate the attachment of the induction assembly 110 to the first surface 192 by enabling fasteners to fixedly attach the housing to the first surface 192. Any type of fastener may be used, including screws, nails, staples, welds, glues, adhesives, or any other suitable fastening mechanism. The properties of the materials used in the structure, such as their electromagnetic permittivity and roughness, may be known, particularly those properties that may be relevant to the attachment of the load assembly 150 to the second surface 194 of the structure 190. As previously stated, the electromagnetic permittivity of the materials used in the structure 190 may be considered and accounted for in the configuration of the switch 122, triggering device 162, induction attaching device 128, and load attaching device 164. More specifically, the electromagnetic permittivity of the materials in the structure 190 may be considered when configuring the threshold magnetic force of the switch 122, the magnitude of the magnetic field generated by the triggering magnet 163, and magnetic force exerted upon the load attaching device 164, which may be accomplished by selective configuration of the magnetic fields generated by and/or exposed to the induction attaching device 128 and load attaching device 164.

Additionally, in scenarios where the structure 190 has a slope, incline, grade, curve, or any vertical component, the surface properties for the second surface 194 may be considered in configuration of the induction attaching device 128 and the load attaching device 164. More specifically, the static and kinetic frictional forces resulting from the force exerted by the coupling between the attaching devices 128 and 164 may be configured to prevent the relative movement of the induction assembly 110 and the load assembly 150 in the presence of external forces, including, as an example only and not by means of limitation, gravity.

In the present embodiment, the induction attaching device 128 and the load attaching device 164 are magnets. Accordingly, the positioning and orientation of the induction attaching device 128 and the load attaching device 164 is determinative in the coupling between them and the magnetic force exerted upon each, most importantly on the load attaching device 164. As shown in FIG. 4, when the induction assembly 110 and the load assembly 150 are in a first orientation with respect to each other, the induction attaching device 128 and the load attaching device 164 are able to couple to each other and exert the necessary force upon the load attaching device 164 to prevent relative movement between the induction assembly 110 and the load assembly 150.

In the embodiment depicted in FIG. 4, where the induction assembly 110 and the load assembly 150 each have a respective longitudinal axis, those axes are in a generally parallel orientation. In contrast, in the embodiment depicted in FIG. 5, the longitudinal axes of the induction assembly 110 and the load assembly 150 are in a generally perpendicular orientation. In this orientation, the induction attaching device 128 and the load attaching device 164 are not coupled to each other, or the coupling therebetween results in the exertion of a force upon the load attaching device 164 that is insufficient to attach the load assembly 150 to the structure 190. Accordingly, the load assembly 150 is not attached to the second surface 194 of the structure 190, and may be removed.

Figure 5:
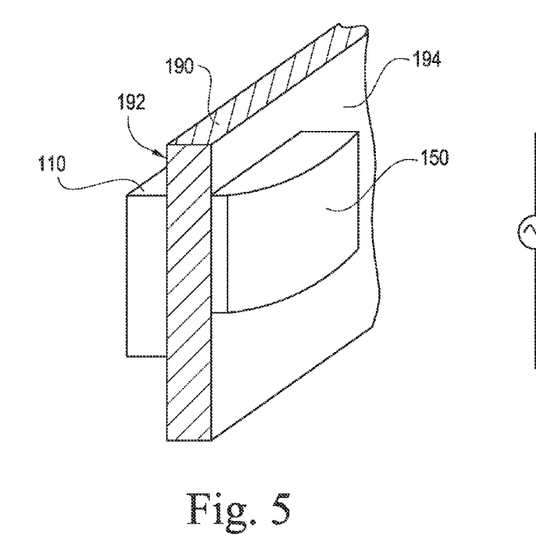
FIG. 5 is another perspective view of the system according to an embodiment of the present invention as depicted in FIG. 2 in a second orientation.

The transition between the respective orientations of the induction assembly 110 and the load assembly 150 depicted between FIGS. 4 and 5 may be accomplished by the exertion of a force by a person who is attempting to alter the attachment of the load assembly 150 to the structure 190. For instance, the user may interface the load assembly 150 with the second surface 194 of the structure 190 in a position that is generally opposite the position to which the induction assembly 110 is attached to the first surface 192 of the structure 190 in an initial orientation that is generally perpendicular to orientation of the induction assembly 110, such that the induction attaching device 128 and the load attaching device 164 are not coupled or are ineffectively coupled. The user may then reorient the load assembly 150 to an orientation that is generally parallel to the induction assembly 110, thereby coupling the induction attaching device 128 and the load attaching device 164, thereby attaching the load assembly 150 to the second surface 194 of the structure 190. It is appreciated that the relative orientations of the induction assembly 110 and the load assembly 150 may be configured such that coupling between the induction attaching device 128 and the load attaching device 164 occurs when the relative orientations of the induction assembly 110 and the load assembly 150 are desirable.

Figure 6:
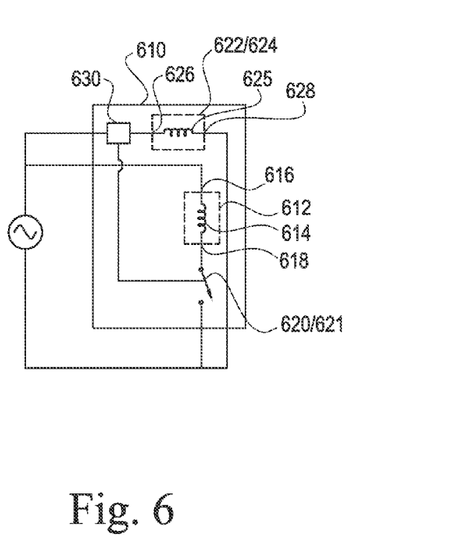
FIG. 6 is a schematic view of an induction assembly of a system for inductively powering an electrical device according to an embodiment of the present invention.

Referring now to FIG. 6, another embodiment of the invention is depicted. Specifically, an additional embodiment of an induction assembly 610 is depicted. In the present embodiment, the induction assembly 610 may include an induction circuit 612 substantially as described as the induction circuit of FIGS. 1-5, having a solenoid 614 and first and second connectors 616 and 618.

Additionally, the induction assembly 610 may include a switch 620. The switch 620 in the present embodiment may be a Hall effect switch 621 capable of determining the magnitude of the strength, intensity, induction, or flux density of an incident magnetic field. Moreover, the Hall effect 621 switch may be configured to transition between first and second states when a magnetic field having strength, intensity, induction, or flux density above a threshold value is incident upon the Hall effect switch 621. Yet further, the Hall effect switch 621 may be configured to provide an indication of the magnitude of the strength, intensity, induction, or flux density of an incident magnetic field to another device or mechanism that is functionally coupled to or in communication with the Hall effect switch 621, discussed in greater detail hereinbelow.

The induction assembly 610 of the present embodiment may further include an attaching device 622. Furthermore, the attaching device 622 may be an electromagnetic circuit 624 having an electromagnet 625, which are known in the rt. An example of an electromagnet is a solenoid having a ferromagnetic material disposed within an interior diameter of the solenoid. However, all types of electromagnets are contemplated and included in the invention. As required by the fundamental operational requirements of an electromagnet, the electromagnet 625 includes first and second connectors 626 and 628 configured to permit the flow of electricity through the electromagnet 625, thereby enabling the electromagnet to generate a magnetic field. Accordingly, the electromagnet 625 may have an operative state when current flows through the solenoid, and a non-operative state when current is not flowing through the solenoid.

The magnitude of the strength, intensity, induction, or flux density of the agnetic field generated by the electromagnet 625 may be controlled and selectively generated by manipulating the amount of current that is passed through the electromagnet 625. Accordingly, the induction assembly 610 may further include a current regulating device 630. The current regulating device 630 may be configured to control the amount of current that is delivered to the electromagnet 625. Accordingly, the magnetic field generated by the electromagnet 625 may be controlled and manipulated through the operation of the current regulating device 630.

As described above, the induction assembly 610 of the present embodiment may include a Hall effect switch 621 configured to determine the magnitude of the strength, intensity, induction, or flux density of a magnetic field incident thereupon, and to provide an indication of that magnitude. The current regulating device 630 may be configured to functionally couple to and be in electronic communication with the Hall effect switch 621 such that the indication of the magnitude of the incident magnetic field on the Hall effect switch 621 controls the operation of the current regulating device 630. More specifically, where a magnetic field having a first magnitude of strength, intensity, induction, or flux density is detected by the Hall effect switch 621, the current regulating device 630 may deliver a first current to the electromagnet 625, thereby producing a magnetic field having a first strength, intensity, induction, or flux density, and where a magnetic field having a second magnitude of strength, intensity, induction, or flux density is detected by the Hall effect switch 621, the current regulating device 630 may deliver a second current to the electromagnet 625, thereby producing a magnetic field having a second strength, intensity, induction, or flux density. The indication provided by the Hall effect switch 621 may be configured to vary directly or indirectly to the magnitude detected of the incident magnetic field.

In the present embodiment, the current regulating device 630 may be a microprocessor configured to control the delivery of current in proportion to an input voltage. The indication provided by the Hall effect switch 621 may be a voltage that is proportional to the magnitude of a characteristic of the magnetic field detected by the Hall effect switch 621. The voltage indicated by the Hall effect switch 621 may function as the input voltage for the current regulating device 630. Accordingly, the microcontroller of the current regulating device 630 may measure the input voltage and deliver a current that is proportional to the input voltage. The determination of the current to be delivered may be based on a calculation performed by the microprocessor. Accordingly, the microprocessor may be programmed to include the formulae necessary to perform such a calculation, as are well known in the art.

Figure 7:
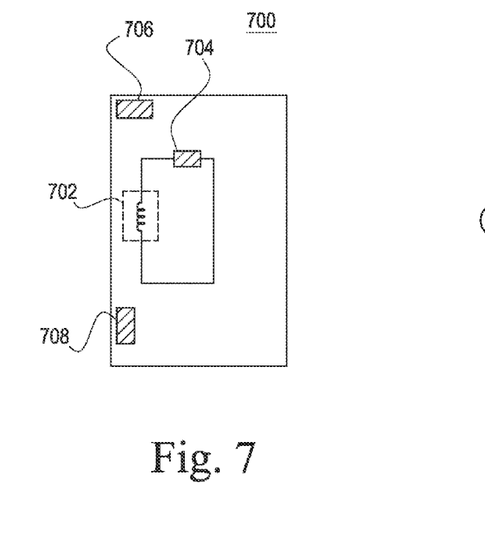
FIG. 7 is a schematic view of a load assembly of a system for inductively powering an electrical device according to an embodiment of the present invention.

Referring now to FIG. 7, a load assembly 700 of the present embodiment is depicted. The load assembly 700 of the present embodiment is substantially similar to the load assembly as depicted in FIGS. 1-5. The load assembly 700 may include a receiver 702, an electrical device 704, an attaching device 706, and a triggering device 708 substantially as described above. However, in the present embodiment, due to the interaction between the Hall effect switch 621 and the current regulating device 630, shown in FIG. 6, the triggering device 708 may be configured to generate a magnetic field that is detected as having a desired magnitude of strength, intensity, induction, or flux density by the Hall effect switch 621, thereby resulting in the electromagnet 625 generating a magnetic field of a desired strength, intensity, induction, or flux density. As stated above, the electromagnet 625 is the attaching device 622 of the induction assembly 610, the magnetic field generated by the electromagnet 625 causes the electromagnet 625 to couple with the attaching device 706 and to exert a force on the attaching device 706, thereby attaching the load assembly substantially as described above. Therefore, the triggering device 708 may be configured to result in a desired force to be exerted upon the attaching device 706. This may permit the induction assembly 600 as depicted in FIG. 6 to couple to varying load assemblies, varying the force exerted on the respective attaching device of the varying load assemblies.

As further explanation, a first load assembly may have a first triggering device configured to generate a first magnetic field. The first magnetic field may cause result in a first force to be exerted on a first attaching device of the first load assembly. The first force may be configured to be only sufficiently strong to prevent the relative movement between the induction assembly and the first load assembly. A second load assembly may include a second triggering device configured to generate a second magnetic field, the second magnetic field resulting in a second force to be exerted on a second attaching device of the second load assembly. That second force may similarly be only sufficiently strong to prevent the relative movement between the induction assembly and the second load assembly. That second force may be greater or less than the first force, or it may be approximately equal to the first force. Accordingly, a single inductive assembly may be functional to couple to varying load assemblies requiring differing forces to be exerted upon their respective attaching devices in order to prevent their relative movement to the induction assembly.

Figure 8:
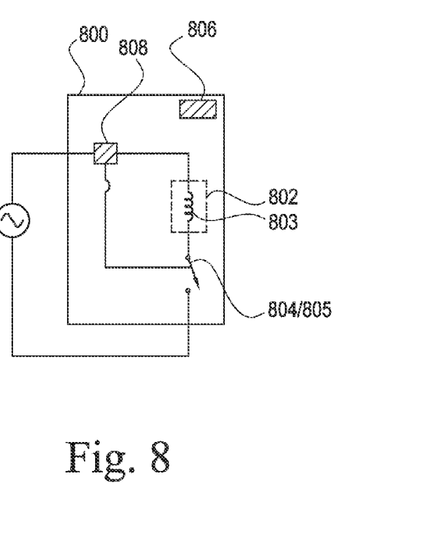
FIG. 8 is a schematic view of an induction assembly of a system for inductively powering an electrical device according to an embodiment of the present invention.

Referring now to FIG. 8, an alternative embodiment of the present invention is depicted. In FIG. 8, another embodiment of an induction assembly 800 is depicted. The induction assembly 800 may be similar to the embodiments of the induction assemblies as depicted in FIGS. 1-5 and 6-7. The induction assembly 800 may include an induction circuit 802 having a solenoid 803, a switch 804, and an attaching device 806. In the present embodiment, the switch 804 may be a Hall effect switch 805 capable of determining the magnitude of the strength, intensity, induction, or flux density of an incident magnetic field. Moreover, the Hall effect 805 switch may be configured to switch between first and second states when a magnetic field having strength, intensity, induction, or flux density above a threshold value is incident upon the Hall effect switch 805. Yet further, the Hall effect switch 805 may be configured to provide an indication of the magnitude of the strength, intensity, induction, or flux density of an incident magnetic field to another device or mechanism that is functionally coupled to or in communication with the Hall effect switch 805.

The present embodiment of the induction assembly 800 may further include a current regulating device 808. The current regulating device 808 may be functionally coupled to and in electric communication with the induction circuit 802. The functional coupling between the current regulating device 808 and the induction circuit 802 may permit the current regulating device 808 to selectively deliver currents of varying amperage to the induction circuit 802. Accordingly, the varying of current delivered to the induction circuit 802 varies the current that passes through the solenoid 803, thereby varying the magnetic field generated by the solenoid 803. As such, the inductive coupling between the induction circuit 802 and a corresponding receiver circuit may be manipulated and selectively controlled by the amount of current delivered by the current regulating device 808. For example, the amount of power delivered by the induction circuit 802 via the inductive coupling may be varied.

As described above, the induction assembly 800 of the present embodiment may include a Hall effect switch 805 configured to determine the magnitude of the strength, intensity, induction, or flux density of a magnetic field incident thereupon, and to provide an indication of that magnitude. The current regulating device 808 may be configured to functionally couple to and be in electronic communication with the Hall effect switch 805 such that the indication of the magnitude of the characteristic of the incident magnetic field on the Hall effect switch 805 controls the operation of the current regulating device 808.

More specifically, where a magnetic field having a first magnitude of strength, intensity, induction, or flux density is detected by the Hall effect switch 805, the current regulating device 808 may deliver a first current to the induction circuit 802, thereby causing the solenoid 803 to produce a magnetic field having a first strength, intensity, induction, or flux density, and where a magnetic field having a second magnitude of strength, intensity, induction, or flux density is detected by the Hall effect switch 805, the current regulating device 808 may deliver a second current to the induction circuit 802, thereby causing the solenoid 803 to produce a magnetic field having a second strength, intensity, induction, or flux density. The indication provided by the Hall effect switch 805 may be configured to vary directly or indirectly to the magnitude detected of the incident magnetic field.

Figure 9:
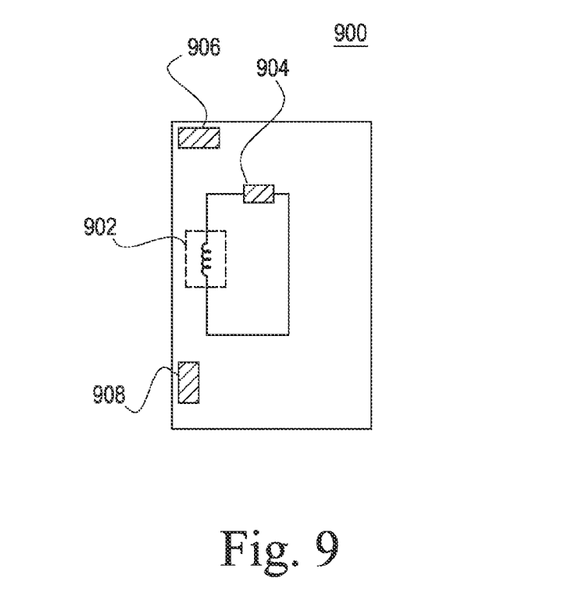
FIG. 9 is a schematic view of a load assembly of a system for inductively powering an electrical device according to an embodiment of the present invention.

Referring now to FIG. 9, a load assembly 900 of the present embodiment is depicted. The load assembly 900 of the present embodiment is substantially similar to the load assemblies depicted in FIGS. 1-5 and 7. The load assembly 900 may include a receiver circuit 902, an electrical device 904, an attaching device 906, and a triggering device 908 substantially as described above. However, in the present embodiment, due to the interaction between the Hall effect switch 805 and the current regulating device 808, the triggering device 908 may be configured to generate a magnetic field that is detected as having a desired magnitude of strength, intensity, induction, or flux density by the Hall effect switch 805, thereby resulting in the induction circuit 802, and hence the solenoid 803, generating a magnetic field of a desired strength, intensity, induction, or flux density.

As described above, the induction circuit 802 is configured to inductively couple with the receiver circuit 902, thereby delivering power to the receiver circuit 902. Therefore, the triggering device 908 may be configured so as to cause the induction circuit 802 to generate a magnetic field of desired strength, intensity, induction, or flux density so as to deliver a desired amount of power to the receiver circuit 902. This may permit the induction assembly 800 to deliver varying amounts of power to varying bad assemblies, varying the magnetic field generated by the inductive circuit 802 in response to the varying triggering devices of the respective bad assemblies.

As further explanation, a first bad assembly may have a first triggering device configured to generate a first magnetic field. The first magnetic field may cause a first inductive magnetic field to be generated by the induction circuit of an induction assembly, thereby delivering a first amount of power to the first bad assembly. The first amount of power may be configured to provide sufficient power for the operation of a first electrical device of the first bad assembly. A second load assembly may include a second triggering device configured to generate a second magnetic field, the second magnetic field resulting in a second inductive magnetic field being generated by the induction circuit, thereby deliver a second amount of power to the second load assembly. The second amount of power may be configured to provide sufficient power for the operation of a second electrical device of the second bad assembly. That second amount of power may be greater or less than the first amount of power, or it may be approximately equal to the first amount of power. Accordingly, a single inductive assembly may be functional to deliver varying amounts of power to varying bad assemblies requiring differing amounts of power for operation of their respective electrical devices.

Figure 10:
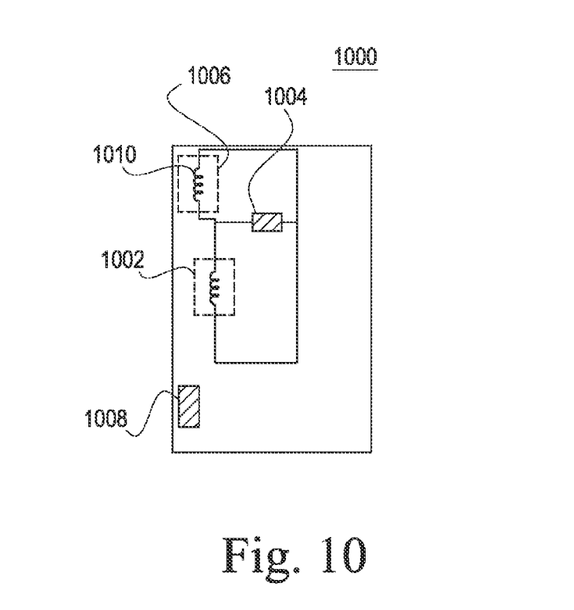
FIG. 10 is a schematic view of a load assembly of a system for inductively powering an electrical device according to an embodiment of the present invention.

Referring now to FIG. 10, an alternative embodiment of the present invention is depicted. Specifically, an embodiment of a load assembly 1000 is depicted. The bad assembly 1000 may be similar to the various embodiments of the load assemblies depicted in the application. More specifically, the load assembly may include a receiver circuit 1002 configured to inductively couple with an induction circuit, an electrical device 1004 functionally coupled to and in electric communication with the receiver circuit 1002, an attaching device 1006, and a triggering magnet 1008. In the present embodiment, the attaching device 1006 may be an electromagnet 1010. The electromagnet 1010 may be any type of electromagnet, such as, for example, a solenoid with a ferromagnetic material disposed within an interior diameter of the solenoid. Accordingly, the electromagnet 1010 may be functionally coupled to and in electric communication with the receiver circuit 1002, enabling electricity to flow through the electromagnet 1010, thereby generating a magnetic field.

The load assembly 1000 may be configured to be operable with an induction assembly as depicted in FIG. 8, the induction assembly having operational capabilities according to the corresponding description. Accordingly, the triggering magnet 1008 of the load assembly 1000 may be configured to generate a magnetic field of specific strength, intensity, induction, or flux density, which is detected by a Hall effect switch of the induction assembly at a desired magnitude, thereby causing the induction circuit of the induction assembly to generate a desired magnetic field. The receiver circuit 1002 may be configured to inductively couple with the induction circuit, thereby receiving power from the induction circuit.

The functional coupling between the receiver circuit 1002 and the electromagnet 1010 enables the delivery of current from the receiver circuit 1002 to the electromagnet. The delivery of current to the electromagnet 1010 causes the electromagnet 1010 to generate a magnetic field. Moreover, the magnetic field generated by the electromagnet 1010 is proportional to the current delivered to the electromagnet 1010. The magnetic field generated by the electromagnet 1010 may be configured to couple the electromagnet 1010 to an attaching device of the induction assembly, thereby resulting in a force being exerted on the electromagnet 1010 substantially as described above, thereby attaching the load assembly 1000 to a surface and preventing movement of the load assembly 1000 with respect to the induction assembly.

The receiver circuit 1002 may further include electrical components configured to deliver current in desired amounts to each of the electrical device 1004 and the electromagnet 1010. More specifically, the electrical device 1004 may require a certain amount of power to operate. Furthermore, the amount of power delivered to the receiving circuit 1002 may be anticipated, and the voltage of the power delivered may similarly be anticipated. Yet further, the magnetic field desired to be generated by the electromagnet 1010 may be known, as well as the amount of current necessary for the electromagnet 1010 to generate that magnetic field. Accordingly, the receiver circuit 1002 may include circuitry to deliver sufficient current of appropriate voltage to each of the electrical device 1004 and the electromagnet 1010 so as to both operate the electrical device 1004 and to enable the electromagnet 1010 to generate a magnetic field of sufficient strength, intensity, induction, or flux density so as to couple with an attaching device of an induction assembly, thereby causing a force to be exerted upon the electromagnet 1010, attaching the load assembly 1000 to a surface of a structure and preventing the movement of the load assembly 1000 relative to the induction assembly.

As further explanation, a first load assembly may have a first triggering device configured to generate a first magnetic field. The first magnetic field may cause a first inductive magnetic field to be generated by the induction circuit of an induction assembly, thereby delivering a first amount of power to a first receiver circuit of the first load assembly. The first receiver circuit may then deliver current to a first electrical device and a first electromagnet, thereby causing the first electrical device to operate and the first electromagnet to generate a first attaching magnetic field. The first attaching magnetic field may couple with an attaching device of the induction assembly resulting in a first force to be exerted upon the first electromagnet and, hence, the first load assembly. The first force may be configured to be only sufficiently strong to prevent the relative movement between the induction assembly and the first load assembly. A second load assembly may include a second triggering device configured to generate a second magnetic field, the second magnetic field resulting in a second inductive magnetic field being generated by the induction circuit, thereby deliver a second amount of power to a second receiver circuit of the second load assembly. The second receiver circuit may then deliver current to a second electrical device and a second electromagnet, thereby causing the second electrical device to operate and the second electromagnet to generate a second attaching magnetic field. The second attaching magnetic field may couple with the attaching device of the induction assembly resulting in a second force to be exerted upon the second electromagnet and, hence, the second load assembly. That second force may similarly be only sufficiently strong to prevent the relative movement between the induction assembly and the second load assembly. That second force may be greater or less than the first force, or it may be approximately equal to the first force. Similarly, the second amount of power may be greater or less than the first amount of power, or approximately equal to the first amount of power. Accordingly, a single inductive assembly may be functional to couple to varying load assemblies requiring differing forces to be exerted upon their respective electromagnets in order to prevent their relative movement to the induction assembly.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

That which is claimed is:

1. A system for inductively providing power to an electrical device comprising:
   a load assembly comprising:
      a receiver circuit,
      an electrical device,
      a first attaching magnet, and
      a triggering device operable to produce a magnetic field; and
   an induction assembly comprising:
      an induction circuit operable to couple to the receiver circuit,
      a switch configured to control the operation of the induction circuit,
      the switch comprising a device operable to determine a magnitude of the magnetic field generated by the triggering device,
      a second attaching magnet provided by an electromagnet having a non-operating state and an operating state, and
      a current regulating device functionally coupled to the second attaching magnet and configured to control an amount of current delivered to the second attaching magnet;

wherein the receiver circuit is operable to inductively couple to the induction assembly and provide power to the electrical device;

wherein the switch is transitionable between a first state and a second state when the load assembly is brought in proximity to the induction assembly;

wherein the induction circuit is inoperable when the switch is positioned in the first state, and operable when the switch is positioned in the second state;

wherein the second attaching magnet is in the non-operating state when the switch is in the first state and in the operating state when the switch is in the second state:

wherein the first attaching magnet is configured to couple to the second attaching magnet when the second attaching magnet is in the operating state;

wherein proximity of the triggering device to the switch causes the switch to transition between the first state and the second state;

wherein the switch is configured to provide an indication of the magnitude of the magnetic field produced by the triggering device to the current regulating device;

wherein the current regulating device is configured to provide current to the second attaching magnet in proportion to the magnitude of the magnetic field indicated by the switch;

wherein the second attaching magnet is configured to generate a magnetic field proportional to the current provided by the current regulating device;

wherein the induction assembly, switch, and first attaching magnet are attachable to a first side of a structure;

wherein the first attaching magnet couples to the second attaching magnet when brought into proximity of the second attaching magnet; and wherein the load assembly is removably attachable to a second side of the structure opposite the second attaching magnet.

2. A system according to claim 1 wherein the switch comprises a Hall effect switch.

3. A system according to claim 1 wherein the induction assembly further comprises a second current regulating device functionally coupled to the induction circuit and configured to control the amount of current delivered to the induction circuit;

wherein the second current regulating device is configured to provide current to the induction circuit proportionate to the magnitude of the magnetic field indicated by the switch; and wherein the induction circuit is configured to generate an electromagnetic field proportional to the current provided by the second current regulating device.

4. A system according to claim 1 wherein the first attaching magnet is functionally coupled to the receiver circuit; and wherein the first attaching magnet is configured to generate a magnetic field when the receiver circuit is inductively coupled to the induction circuit.

5. A system according to claim 4 wherein the first attaching magnet is configured to generate a magnetic field proportional to power received by the receiver circuit.

6. A system according to claim 1 wherein the coupling of the second attachment magnet to the first attachment magnet is determined by their relative orientation.

7. A system according to claim 4 wherein the first attachment magnet couples to the second attachment magnet when oriented parallel to the second attachment magnet; and wherein the first attachment magnet does not couple to the second attachment magent when oriented perpendicular to the second attachment magnet.

8. A system according to claim 1 wherein the electrical device comprises an illuminant, and wherein the illuminant is operable to be energized by the receiver circuit, thereby emitting light.

9. A system according to claim 6 wherein the illuminant is a light-emitting diode.

10. A system according to claim 1 wherein the switch transitions from the second state to the first state when the load assembly is removed from proximity to the induction assembly.

11. A system according to claim 1 further comprising:
a fastener; and
a housing having an aperture configured to permit the fastener to be positioned therethrough;
wherein the induction circuit, the switch, and the second attaching magnet are disposed within the housing; and
wherein the fastener is configured to be positioned through the aperture of the housing and attached to the first side of the structure.

12. A system for providing electrical power to and remotely attaching a lighting device comprising:
a load assembly comprising:
a receiver circuit,
an illuminant,
a first attaching magnet, and
a triggering device configured to generate a magnetic field; and
an induction assembly comprising:
an induction circuit operable to couple to the receiver circuit,
a switch configured to control the operation of the induction assembly, the switch comprising a device operable to determine a magnitude of the magnetic field generated by the triggering device,
a second attaching magnet, and
a current regulating device functionally coupled to the induction circuit and configured to control the amount of current delivered to the induction circuit;
wherein the receiver circuit is operable to inductively couple to the induction circuit and provide power to the illuminant;
wherein the switch comprises a Hall effect switch;
wherein the switch is transitionable between a first state and a second state when the triggering device is brought in proximity to the switch;
wherein the induction circuit is inoperable when the switch is positioned in the first state, and operable when the switch is in the second state;
wherein proximity of the triggering device to the switch causes the switch to transition between the first state and the second state;
wherein the current regulating device is configured to provide current to the induction circuit proportionate to the magnitude of the magnetic field indicated by the switch;
wherein the induction circuit is configured to generate an electromagnetic field proportional to the current provided by the current regulating device;
wherein the induction assembly is attachable to a first side of a structure; and
wherein the first attaching magnet couples to the second attaching magnet when brought into proximity of the second attaching magnet; and
wherein the load assembly is removably attachable to a second side of the structure opposite the second attaching magnet.

13. A system according to claim 12 wherein the second attaching magnet is an electromagnet having a non-operating state and an operating state; wherein the second attaching magnet is in the non-operating state when the switch is in the first state; wherein the second attaching magnet is in the operating state when the switch is in the second state; and wherein the first attaching magnet couples to the second attaching magnet when the second attaching magnet is in the operating state.

14. A system according to claim 12 wherein the induction assembly further comprises a second current regulating device functionally coupled to the second attaching magnet and configured to control the amount of current delivered to the second attaching magnet;
- wherein the load assembly comprises a triggering device operable to produce a magnetic field;
- wherein the switch comprises a device operable to determine a magnitude of the magnetic field generated by the triggering device;
- wherein the proximity of the triggering device to the switch causes the switch to transition between the first state and the second state;
- wherein the switch provides an indication of the magnitude of the magnetic field produced by the triggering device to the first current regulating device;
- wherein the first current regulating device provides current to the second attaching magnet in proportion to the magnitude of the magnetic field indicated by the switch; and
- wherein the second attaching magnet generates a magnetic field proportional to the current provided by the first current regulating device.

15. A system according to claim 12 wherein the coupling of the second attachment device to the first attachment device is determined by their relative orientation.

16. A system according to claim 12 wherein the first attachment magnet couples to the second attachment magnet when oriented parallel to the second attachment magnet; and wherein the first attachment magnet does not couple to the second attachment magnet when oriented perpendicular to the second attachment magnet.

17. A system according to claim 12 wherein the illuminant is a light-emitting diode.

18. A method of installing a lighting system that includes a load assembly having a receiver circuit, an illuminant electrically coupled with the receiver circuit, a first attaching magnet, and a triggering device operable to produce a magnetic field, and an induction assembly having an induction circuit, a switch functionally coupled to the induction circuit, a current regulating device functionally coupled to the induction circuit and configured to control the amount of current delivered to the induction circuit, and a second attaching magnet, the method comprising the steps of:
- attaching the induction assembly to a first side of a structure;
- connecting the induction circuit to a power source;
- positioning the load assembly to interface with a second side of the structure in a location opposite and in proximity to the induction assembly;
- coupling the first attaching device magnet to the second attaching magnet;
- generating a magnetic field by the triggering device;
- transitioning the switch to transition between a first state and a second state to regulate the flow of electricity through the induction circuit;
- determining by the switch a magnitude of the magnetic field generated by the triggering device;
- energizing the induction circuit by the current regulating device by permitting current to flow therethrough proportionate to the magnitude of the magnetic field indicated by the switch;
- inductively coupling the induction circuit to the receiving circuit;
- delivering power to the receiver circuit via the inductive; and
- delivering the power received by the receiver circuit to the illuminant.

19. A method according to claim 18 wherein the step of positioning the load assembly further comprises the steps of:
- orienting the load assembly in an orientation that is rotated about 90 degrees from the orientation of the induction assembly;
- positioning the load assembly to interface with a second side of the structure in a location opposite the induction assembly; and
- rotating the load assembly so as to have an orientation that is rotated about 0 degrees from the orientation of the induction assembly.

20. A method according to claim 18 wherein the illuminant is positioned within the load assembly housing so as to emit visible radiation in a desired direction.

21. A method according to claim 18 further comprising the steps of:
- repositioning the load assembly to a position outside beyond the proximity of the induction assembly, thereby decoupling the induction circuit and the receiver circuit, decoupling the first attaching magnet from the second attaching magnet, detaching the load assembly from the second side of the structure, and ceasing the interaction between the triggering device and the switch;
- transitioning the switch from the second state to the first state; and
- preventing the flow of electricity through the induction circuit, thereby de-energizing the induction circuit.

* * * * *